US005480819A

United States Patent [19]
Huang

[11] Patent Number: 5,480,819
[45] Date of Patent: Jan. 2, 1996

[54] METHOD OF MANUFACTURE OF HIGH COUPLING RATIO FLASH MEMORY CELL

[75] Inventor: Heng-Sheng Huang, Taipei, Taiwan

[73] Assignee: United Microelectronics Corporation, Hsinchu, Taiwan

[21] Appl. No.: 275,271

[22] Filed: Jul. 15, 1994

[51] Int. Cl.$^6$ ............................................. H01L 21/8747
[52] U.S. Cl. .................. 437/43; 437/48; 257/316
[58] Field of Search ................... 437/43, 48, 49, 437/52; 257/316, 984

[56] References Cited

U.S. PATENT DOCUMENTS

| | | | |
|---|---|---|---|
| 4,780,424 | 10/1988 | Holler et al. | 437/29 |
| 5,147,813 | 9/1992 | Woo | 437/43 |
| 5,196,361 | 3/1993 | Ong et al. | 437/43 |
| 5,256,584 | 10/1993 | Hartmann | 437/43 |
| 5,268,318 | 12/1993 | Harari | 437/43 |
| 5,270,226 | 12/1993 | Hori et al. | 437/35 |
| 5,364,806 | 11/1994 | Ma et al. | 437/43 |

OTHER PUBLICATIONS

Wolf, "Silicon Processing for the VLSI Era, vol. 2: Process Integration", pp. 327–331, 1986.
John P. Uyemura "Circuit Design for OMOS VLSI," pp. 66–69, 1992.

Primary Examiner—George Fourson
Assistant Examiner—Richard A. Booth
Attorney, Agent, or Firm—George O. Saile; Graham S. Jones, II

[57] ABSTRACT

A process of fabricating an array of floating gate memory devices on a substrate comprises forming elongated spaced apart parallel ion implanted field implant regions in the substrate, forming elongated spaced apart parallel buried bit lines in the substrate orthogonally directed relative to the field implant regions, forming field oxide regions over the buried bit lines and field implant regions, and growing a silicon dioxide gate oxide layer having a thickness of from approximately 80 Å to approximately 300 Å between the field oxide regions, forming a plurality of first gate members from a first layer of polysilicon, the first gate members being disposed over the gate oxide layer, forming a layer of interpolysilicon dielectric over the first gate members having a thickness of approximately 150 Å, forming elongated second gate members from a second layer of polysilicon over the layer of interpolysilicon dielectric and over the first gate members, the second gate members extending generally perpendicular to buried bit lines.

4 Claims, 15 Drawing Sheets

METHOD OF MANUFACTURE OF HIGH COUPLING RATIO FLASH MEMORY CELL

BACKGROUND OF THE INVENTION

1. Field of the Invention

This invention relates to semiconductor devices and more particularly to flash memory cells.

2. Description of Related Art

U.S. Pat. No. 4,780,424 of Holler et al "Process for Fabricating Electrically Alterable Floating Gate Memory Devices" shows a tunnel oxide in an EPROM cell.

The limitations of conventional flash memory cells is that the size of a Mask ROM cannot be shrunk. Secondly, there is a problem of over erasure, i.e. sometimes the erase action in one cell affects a neighboring (adjacent) cell. Thirdly, a relatively high voltage multiple voltage level power supply which requires relatively high power levels with a voltage of greater than 7 Volts.

In the past hot electrons have been a problem. In Uyemura "Circuit Design for CMOS VLSI," pp. 66–69 it is stated that "Hot electron effects have been observed in MOSFET's, particularly in devices with channel lengths smaller than 1 micron. Standard transistors can be degraded by tunnelling effects . . . . Highly energetic particles can leave the silicon and enter the gate oxide. Trapped electrons increase the oxide charge $Q_{ox}$, leading to instability of the threshold voltage. Long-term reliability problems may result from this mechanism. In addition, hot electrons may induce leakage gate current $I_g$ and excessive substrate current $I_s$." The use of LDD (Lightly Doped Drain) structures have been used to overcome the problem of hot electrons.

SUMMARY OF THE INVENTION

An advantage of this invention is a high capacitive coupling ratio greater than about 80%. Programming is done with 5 Volt hot electron injection and erasing: tunneling. Further there is a single power supply. Word line erasing is employed whereas the conventional method is block erasing. Finally, there is higher density after PAD oxide and $Si_3N_4$ deposition than prior art systems.

A more reliable back end process is provided because the polysilicon self-aligned etching protects from overetching by means of a thick FOX structure. A floating gate covers the channel region serving as a protective mask so the regions of the device without any protection from the polysilicon 1 layer (from which the floating gate is formed) are protected with a thick FOX layer which serves as a mask to protect the substrate.

In accordance with this invention, a process of fabricating an array of floating gate memory devices on a substrate comprises forming elongated spaced apart parallel ion implanted field implant regions in the substrate, forming elongated spaced apart parallel buried bit lines in the substrate orthogonally directed relative to the field implant regions, forming field oxide regions over the buried bit lines and field implant regions, and growing a silicon dioxide gate oxide layer having a thickness of from approximately 80 Å to approximately 300 Å between the field oxide regions, forming a plurality of first gate members from a first layer of polysilicon, the first gate members being disposed over the gate oxide layer, forming a layer of interpolysilicon dielectric over the first gate members having a thickness of approximately 150 Å, forming elongated second gate members from a second layer of polysilicon over the layer of interpolysilicon dielectric and over the first gate members, the second gate members extending generally perpendicular to buried bit lines.

Preferably, the channel length $L_{eff}$ is approximately 0.3 µm.

Preferably, the floating gate has a size from approximately 0.6 µm to approximately 0.7 µm.

Preferably, the capacitive coupling ratio is approximately 80%.

Preferably, a silicon nitride layer and a photoresist mask are employed in forming the field implant regions and the buried bit lines.

Preferably, a pocket type cell is produced with field oxide surrounding a channel region.

Preferably, the peripheral field oxide regions and the field oxide regions of the array are defined by the same photomask and the same silicon nitride layer.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention provides a high coupling ratio by means of forming a FOX structure which surrounds a small channel region. Above a gate or tunnel oxide layer, two layers of polysilicon separated by an interpolysilicon layer are formed.

Figure 1:
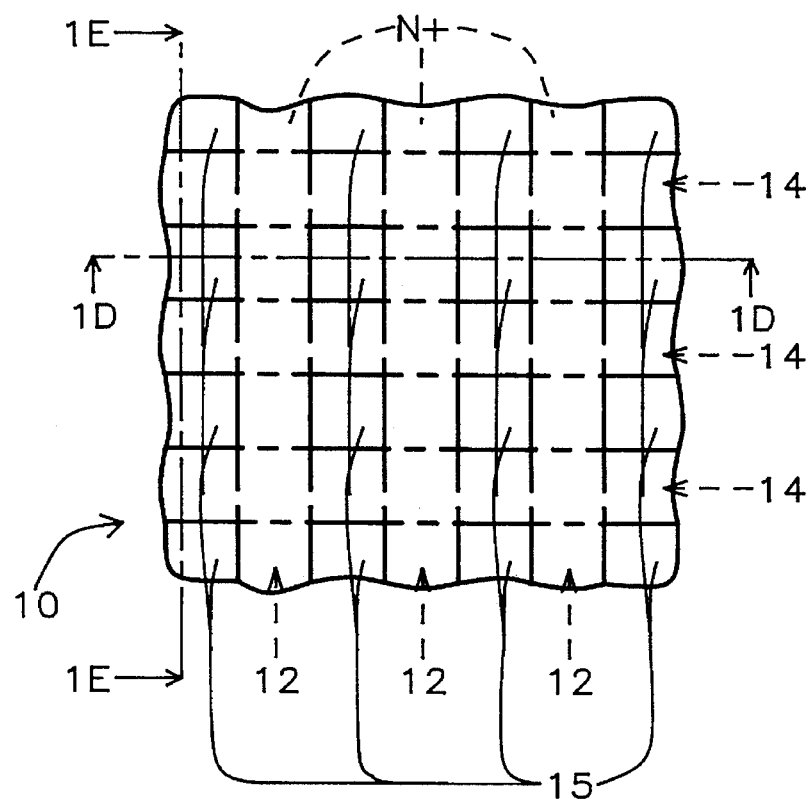
FIG. 1A shows a fragmentary plan view of a semiconductor flash memory device with a matrix of memory cells in accordance with this invention with an array of vertically oriented buried N+ (BN+) conductor regions in a P− doped substrate composed of silicon doped with boron and a horizontally disposed array of field implantation (P-type) regions with an x, y array of isolated square silicon nitride blocks separated by field implantation (P-type) regions and buried N+ conductor regions.
FIG. 1B is a perspective view showing the device 10 of FIG. 1A with the silicon nitride blocks 15 seen above the vertically oriented N+ regions 12 and the horizontally extending P regions 14.
FIGS. 1C–1E show the process of forming the device of FIGS. 1A and 1B.

FIG. 1A shows a fragmentary plan view of a semiconductor flash memory device 10 with a matrix of memory cells in accordance with this invention. There is an array of vertically oriented buried N+ (BN+) conductor regions 12 in a P− doped substrate composed of silicon doped with boron and a horizontally disposed array of field implantation (P-type) regions 14 with an x, y array of isolated square silicon nitride $Si_3N_4$ blocks 15 separated by field implantation (P-type) regions 14 and buried N+ conductor regions 12.

Figure 1B:
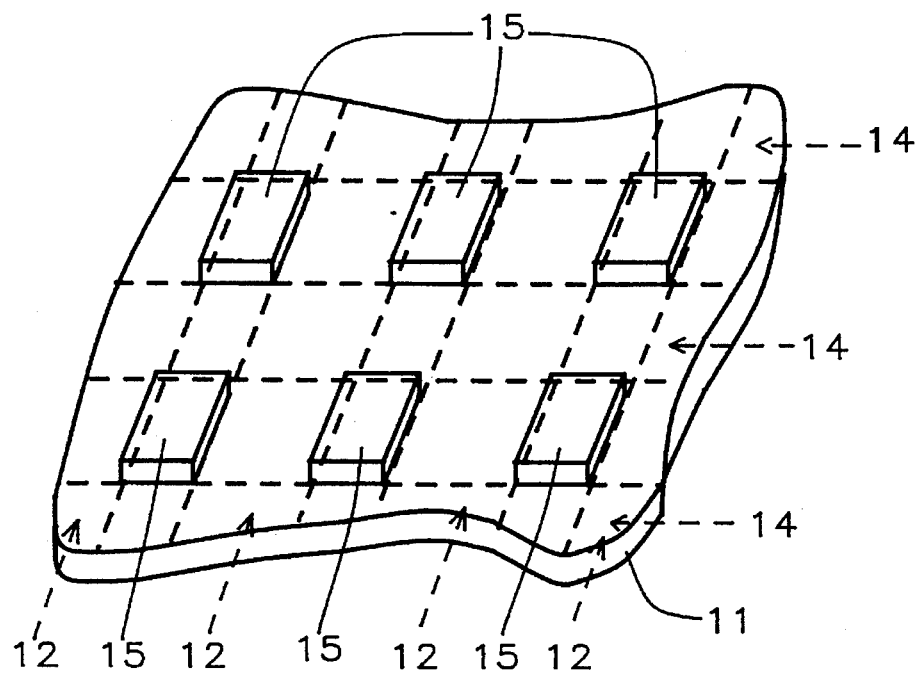

FIG. 1B is a perspective view showing the device 10 of FIG. 1A with the silicon nitride blocks 15 seen above the vertically oriented N+ regions 12 and the horizontally extending P regions 14.

Figure 1C:
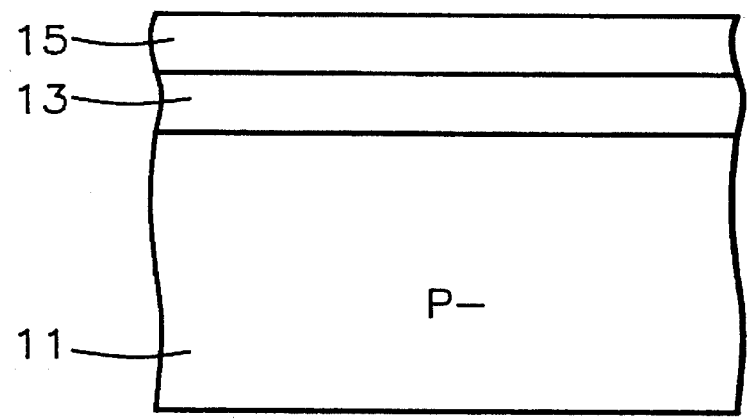
Figure 1D:
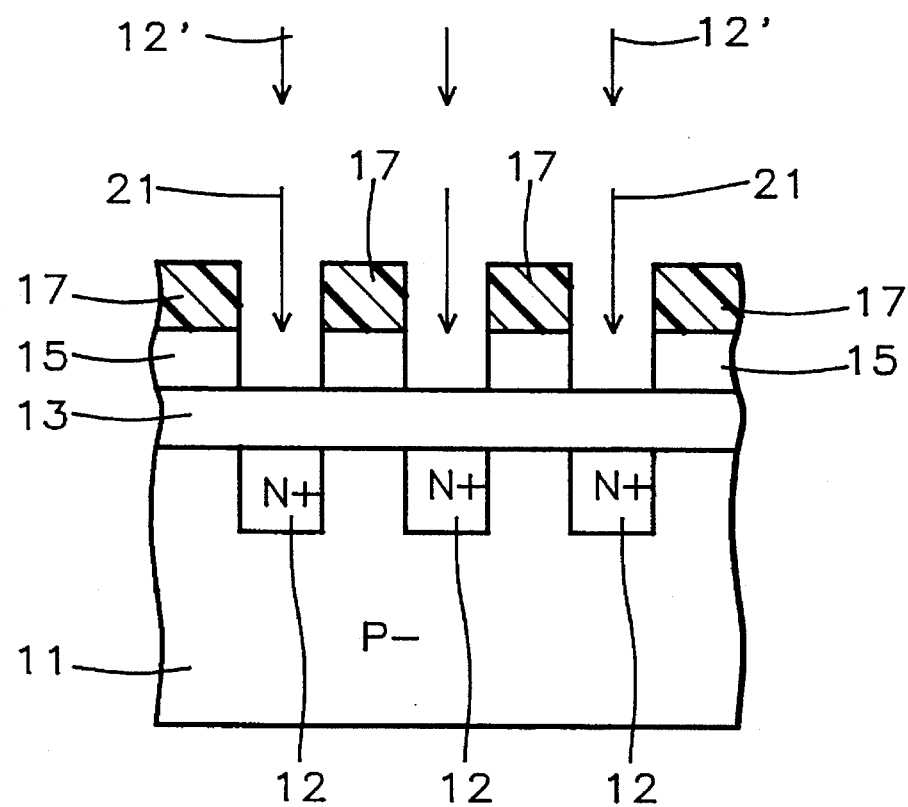

The process involved in forming the product of FIGS. 1A–1B begins as shown in FIG. 1C with coating a lightly doped silicon semiconductor substrate 11 with a pad layer of silicon oxide 13 by a process such as thermal oxidation and then forming a layer of silicon nitride 15. Then referring to FIG. 1D, a layer of photoresist 17 is deposited and then photolithographically exposed and developed to form a BN+ mask 17 to be used for N+ ion implantation of buried conductor lines 12. First, the BN+ mask 17 is employed to remove selected portions of the silicon nitride layer 15 forming squares 15 and openings 21 therebetween. Then BN+ regions 12 in the silicon substrate 11 are formed by ion implantation of ions 12' of arsenic ($As^{75}$) or phosphorous ($P^{31}$) through the openings 21 Just formed into buried N+ regions 12 the substrate 11. The dopant ions 12' are applied at a preferred dose of 2E15 $cm^{-2}$ of $As^{75}$ at a preferred energy of 120 keV, and a depth of ion implanting of approximately 2,000 Å. A range of energies from approximately 50 keV to approximately 300 keV is possible. A range of doses from approximately 1E14 $cm^{-2}$ to approximately 1E16 $cm^{-2}$ is possible. A range of depths of ion implanting from approximately 300 Å to approximately 3,000 Å is possible.

Next, the BN+ photoresist mask 17 is removed.

Figure 1E:
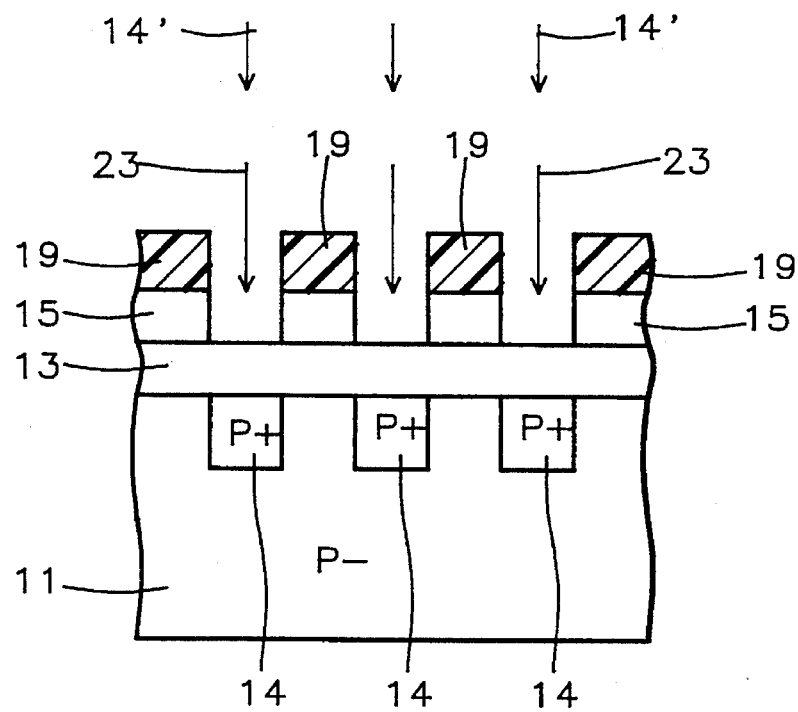

The process continues as shown in FIG. 1E including applying a second photoresist mask 19 to form parallel lines 14 on the cell array, and active patterns on the periphery of the circuit, for field implant (or active) layer masking.

Next, portions of the silicon nitride layer 15 are removed by etching through openings in the second mask 19. Then P regions 14 in the silicon substrate 11 are formed by ion implantation of dopant ions 14' through the openings 23 Just formed into buried P regions 14 in the substrate 11. Dopant ions 14' containing boron composed of $BCl_2$, $B^{11}$, or $BF_2$ are implanted through the openings 23 between the silicon nitride squares 15 into zone 14 of the substrate of device 10. The dopant ions 14' are applied at a preferred dose of 1E12 $cm^{-2}$ of $BF_2$ at a preferred energy of 120 keV, the ions implanted to a depth of approximately 300 Å. A range of energies from approximately 30 keV to approximately 200 keV is possible. A range of doses from approximately 4E11 $cm^{-2}$ to approximately 5E12 $cm^{-2}$ is possible. A range of depths of ion implanting from approximately 300 Å to approximately 1,500 Å is possible. This step should be processed before the field implant.

Alternately, lines 14 can be patterned first followed by patterning of lines 12 or vice versa.

Next follows a step of implantation of p-type ions for preparation for the field implantation.

Next in the process of forming the structures of FIGS. 1A–1E, a conventional field oxidation process is performed in all of the regions surrounding the silicon nitride blocks 15. The field oxidation process uses thermal oxidation at 850° C. to 950° C. in $O_2$ and $H_2O$.

Figure 7:
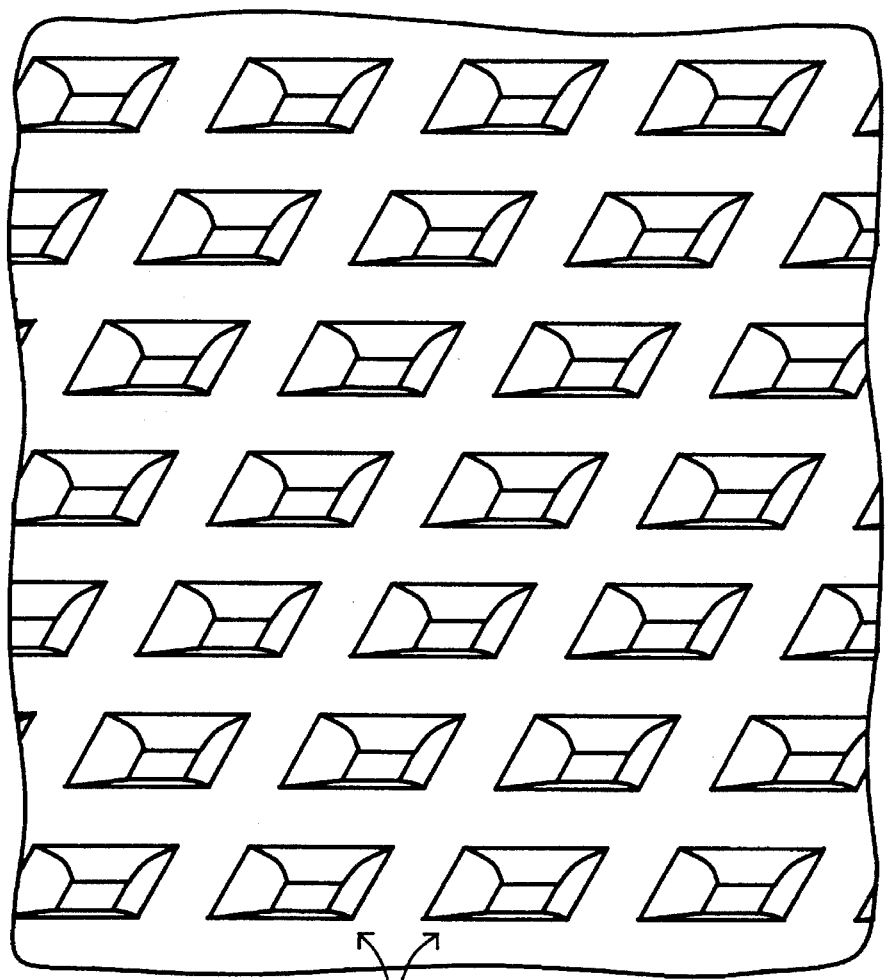
FIG. 7 shows a perspective view of an array of unit pocket cells in accordance with this invention.
Figure 8:
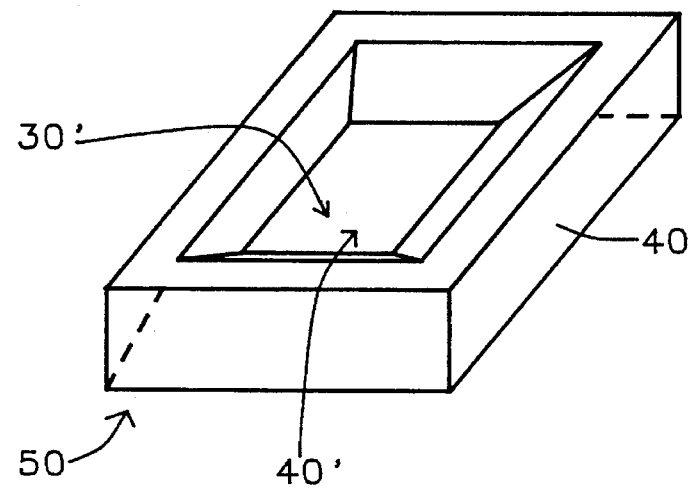
FIG. 8 shows a unit (single) pocket cell from FIG. 7 with a substrate and a field oxide region at the base of a hollow pocket formed in the center of the unit pocket cell.

Next, $Si_3N_4$ blocks 15 are etched away using hot phosphoric acid producing the pattern shown in FIGS. 7 and 8.

The purpose of this process is to provide many pocket type cell structures as in FIG. 8 in cell array regions as in FIG. 7, and at the same time finish the peripheral field oxide (FOX) process for recessed isolation between active regions in the peripheral circuit.

Figure 2:
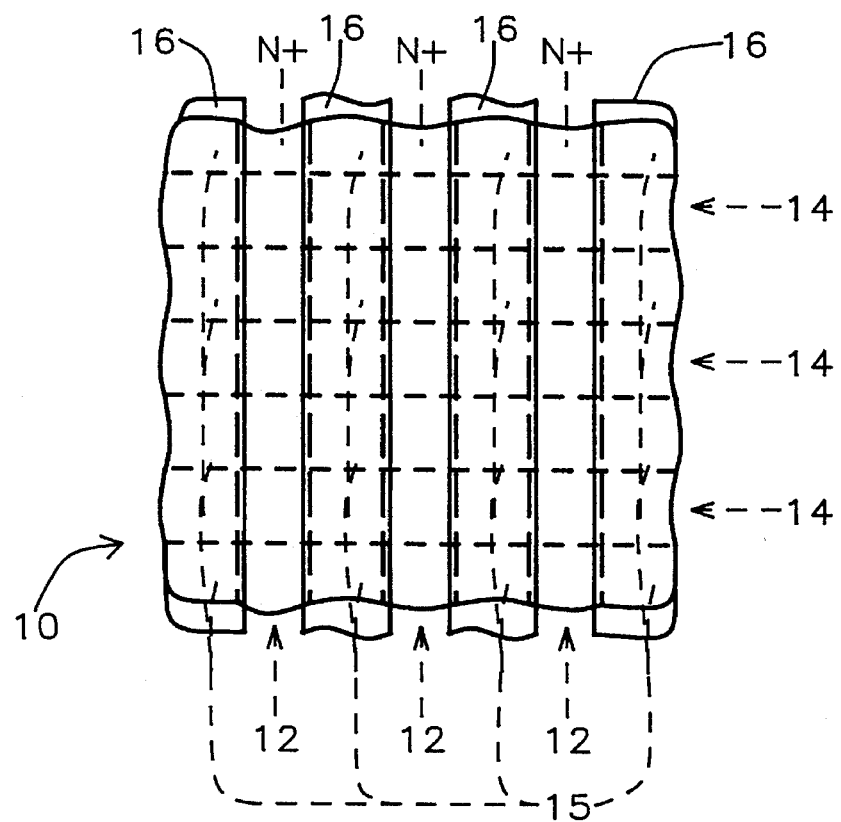
FIG. 2 shows a fragmentary plan view of the semiconductor flash memory device with a matrix of memory cells of FIG. 1A after addition of polysilicon 1 lines on the surface of the device in accordance with this invention overlapping with and above an array of vertically oriented buried N+ regions and a horizontally disposed array of field implantation regions with $Si_3N_4$ blocks in an x, y array of isolated squares separated by field implantation regions and buried N+ regions.

FIG. 2 shows a fragmentary plan view of the semiconductor flash memory device with a matrix of memory cells of FIG. 1A after addition of polysilicon 1 lines 16 on the surface of the device in accordance with this invention overlapping with and above an array of vertically oriented buried N+ (BN+) regions 12 and a horizontally disposed array of field implantation regions 14 with $Si_3N_4$ blocks 15 in an x, y array of isolated squares separated by field implantation regions 14 and buried N+ regions 12.

Figure 3:
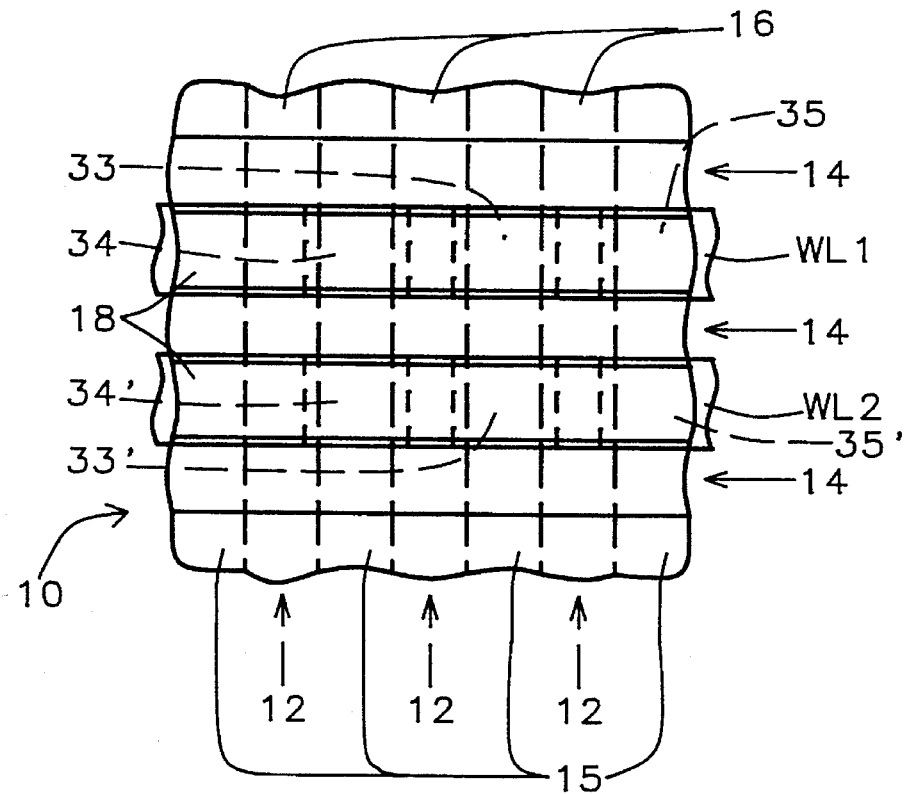
FIG. 3 shows a plan view of the semiconductor flash memory device of FIG. 2 later in the process of manufacture with a matrix of memory cells after etching of polysilicon 1 lines leaving floating gates, and subsequent addition of a polysilicon 2 layer for forming wordlines which are patterned by etching.

FIG. 3 shows a plan view of the semiconductor flash memory device of FIG. 2 later in the process of manufacture with a matrix of memory cells after etching of polysilicon 1 lines 16 leaving floating gates 33, 33' and 34, 34', 35, and 35', and subsequent addition of a polysilicon 2 layer for forming wordlines WL1 and WL2 which are patterned by etching, as shown.

Figure 4:
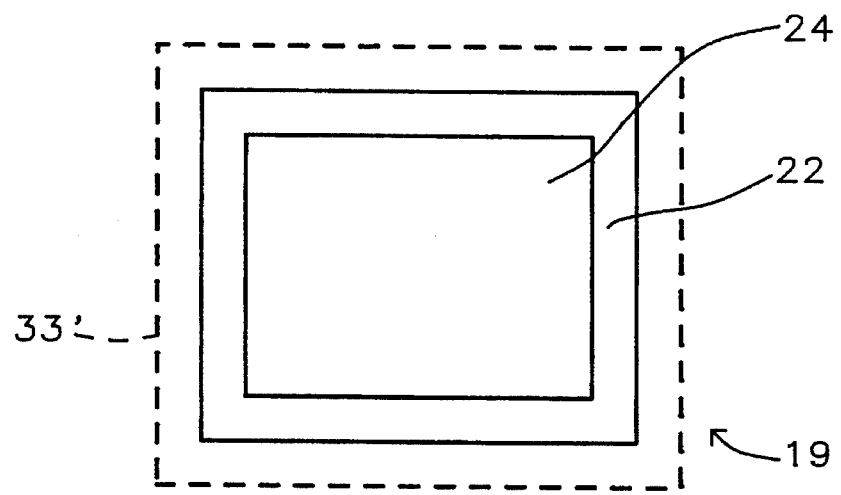
FIG. 4 shows a plan view of a unit cell with an active region, an effective channel region, and a floating gate region.

FIG. 4 shows a plan view of a unit cell 19 with an active region 22, an effective channel region 24, and a floating gate region 33'. One can achieve a high and stable coupling ratio for a flash cell by using this design. A short channel is produced, e.g. 0.3 μm and a high coupling ratio such as 85%.

There will be a 5 Volt drain voltage making programming possible while maintaining a high and stable coupling ratio.

A single 50 Volt power supply with charge pumping circuit to erase charge by tunneling can be adopted to erase without overerasing due to the stable coupling ratio.

Figure 5:
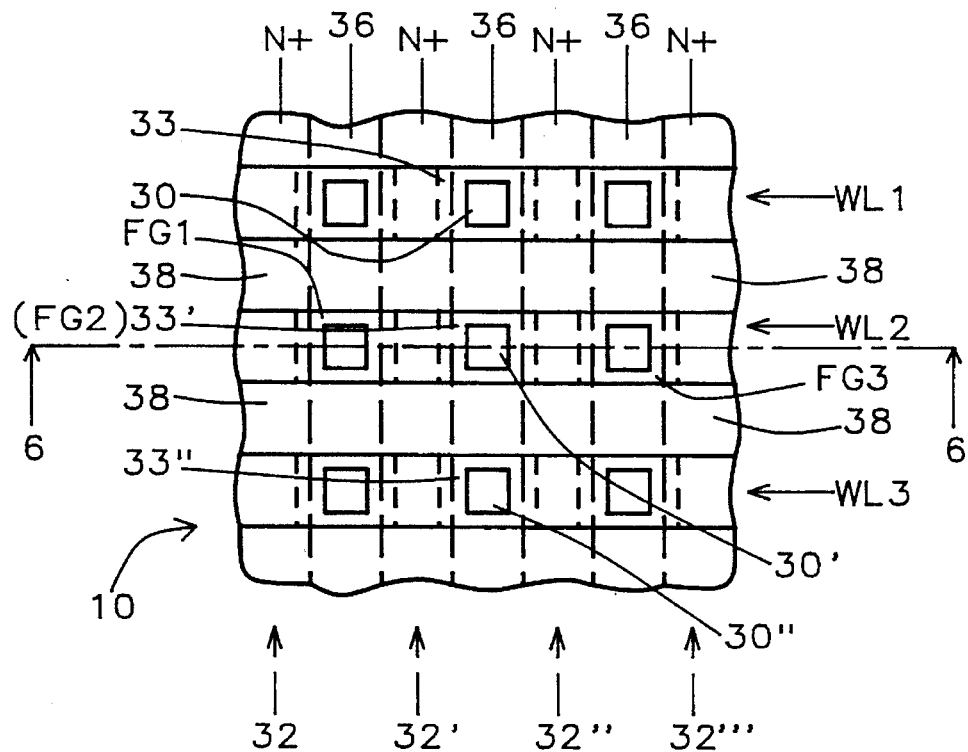
FIG. 5 is a plan view of a device in accordance with this invention. Buried bit lines are buried in a semiconductor substrate. Effective channel regions are shown surrounded by floating gate regions above the semiconductor substrate and the word lines.

FIG. 5 is a plan view of a device in accordance with this invention. Buried bit lines 32, 32', 32", and 32"' are buried in a semiconductor substrate. Effective channel regions 30, 30', and 30" are shown surrounded by floating gate regions 33, 33', and 33" above the semiconductor substrate and the word lines WL1, WL2 and WL3. Regions 36 comprise field isolation regions and active regions which include the channel regions 33, 33', and 33".

Figure 6:
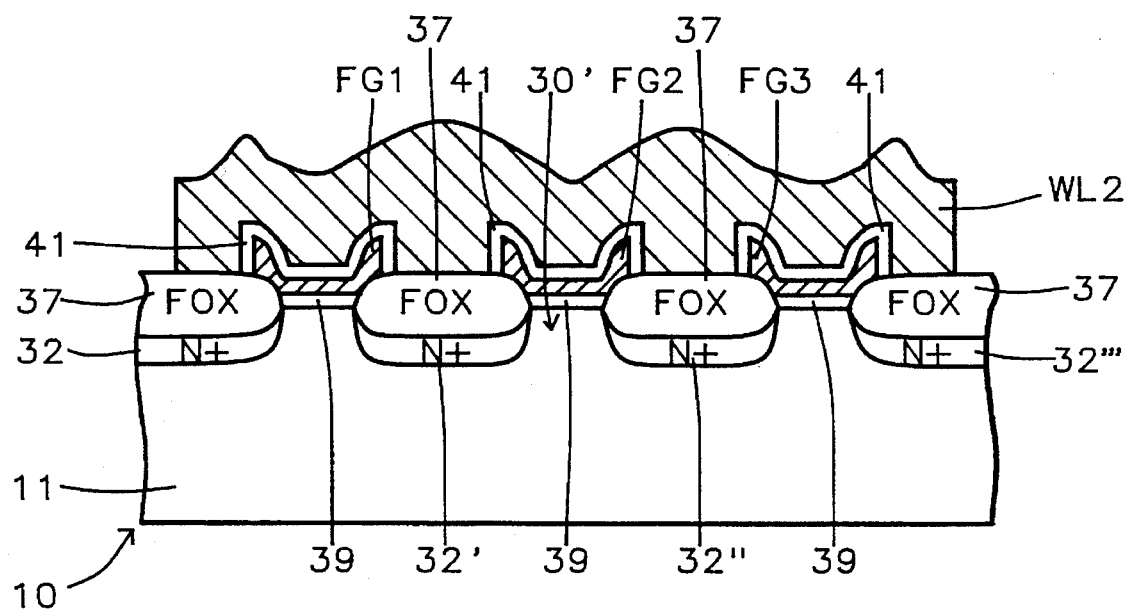
FIG. 6 shows a similar device to that shown in FIG. 5 which is a sectional view through the gates along section line 6—6 in FIG. 5.

FIG. 6 shows a similar device to that shown in FIG. 5 which is a sectional view through the gates along section line 6—6 in FIG. 5. FIG. 6 shows buried bit lines 32, 32', 32", and 32"' buried in a semiconductor substrate 10. Effective channel regions 30, 30', and 30" are shown surrounded by overlying floating gate regions 33, 33' (FG2), and 33" above the semiconductor substrate. The width of the floating gate is between about 0.6 μm and 0.7 μm. The $L_{eff}$ which is the space between the buried N+ lines 32' and 32"' is about 0.3 μm. The gate oxide 39, 39', 39" has a thickness of about 100 Å. The effective thickness of the the ONO layer 41 is greater than about 150 Å.

Single 5 Volt: programming, operation

Hot e– programming is provided, due to the high coupling ratio, so there charge pumping is not needed for higher drain voltage. One advantage of this structure is that a smaller programming current is possible (also due to high coupling ratio) which allows the elimination of charge pumping.

Erasure of the data in a cell is provided by applying a 5 Volt or larger voltage between the substrate and word line electrodes in FIG. 6. Tunnelling erasure can be adopted with a smaller erase voltage since the cell has a higher coupling ratio. Ability to overcome the problem can be improved with the help of this stable coupling ratio characteristic and the use of suitable negative voltage on the word line electrode.

$L_{eff}$: 0.3 μm (channel 0.3μm×0.3 μm)—that is to say that the effective channel length is 0.3 μm.

Floating gate size: 0.6 μm×0.6 μm (or 0.7 μm×0.7 μm)(or 0.7 μm×0.5 μm)—that is to say that the floating gate area has a width of 0.6 μm and a length of 0.6 μm.

The relationship between the high coupling ratio and the short channel effect is well known to those skilled in the art.

The typical drain programming voltage is about 7 Volts. The short channel effect and the high coupling ratio make the low drain programming voltage (for example 5 Volts) possible.

In a read operation the typical read voltage is 5 Volts. In accordance with this invention a lower control gate and drain voltage (for example 3 Volts.) For the future trend of low power applications, 3 Volts is the trend.

Erasure of information if provided by the wordline erase or (erase-wordline.)

Adjust control gate and substrate voltage to avoid over erasure (easily controlled if the coupling ratio is 80% and stable.) Since the coupling ratio is stable, we can choose a negative voltage on the control gate and a positive voltage on the substrate. These two voltage values are determined by the minimum electric field on the tunneling oxide which field results in a larger tunneling current.

FIG. 7 shows a perspective view of an array of unit pocket cells 50 in accordance with this invention.

FIG. 8 shows a unit (single) pocket 50 cell from FIG. 7 with a substrate 40 and a channel region 30' at the base of a hollow pocket 40' formed in the center of the unit pocket cell 50.

Figure 9:
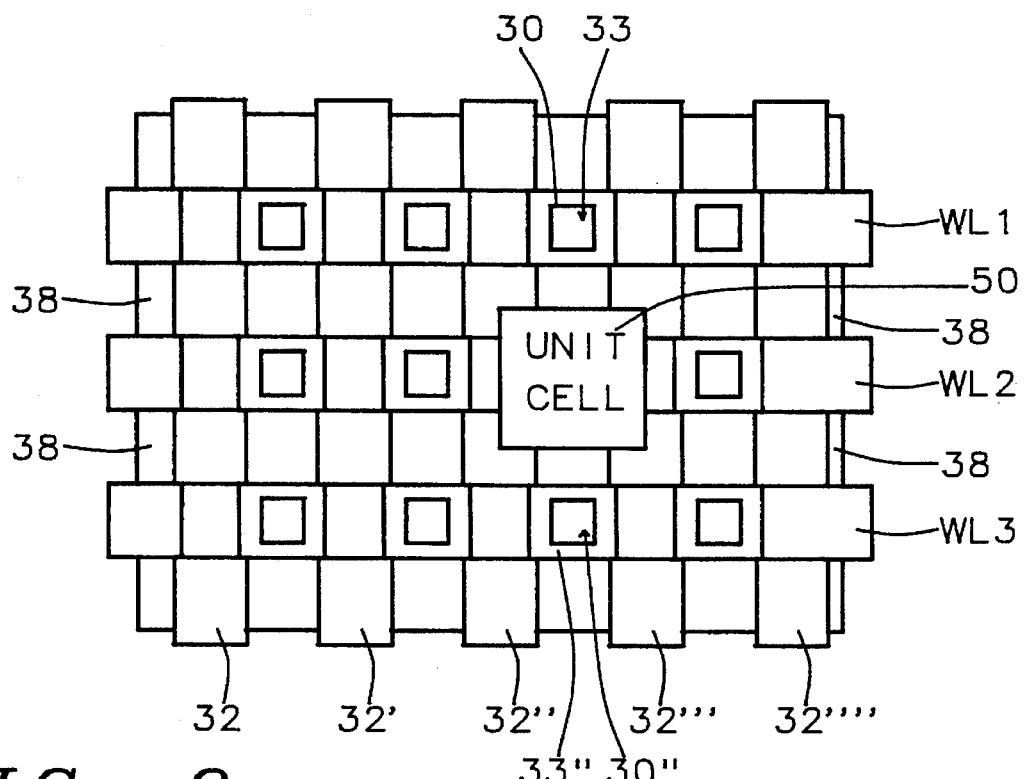
FIG. 9 is a plan view of an array of cells with the elements of FIG. 5 and a unit cell.

FIG. 9 is a plan view of an array of cells with the elements of FIG. 5 and a unit cell 50.

Figure 10A:
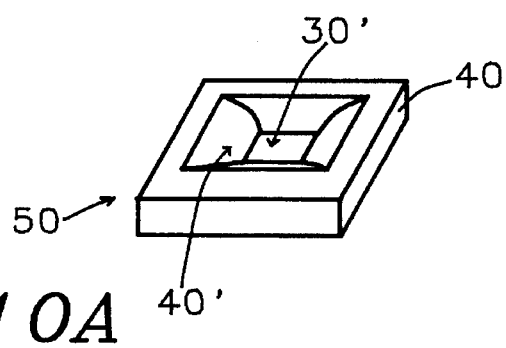
FIG. 10A shows an early stage of unit pocket cell with the field oxide region on the periphery and field oxide region at the base of the hollow pocket.

FIG. 10A shows an early stage of unit pocket cell 50 with the channel region 40 on the periphery and field oxide region 30' at the base of the hollow pocket 40'.

Figure 10B:
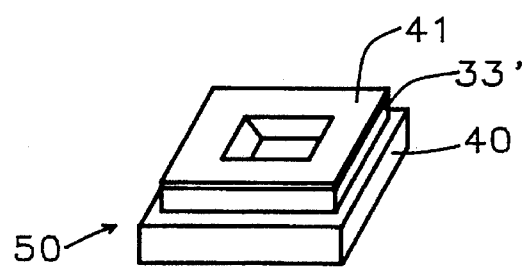
FIG. 10B shows the product of FIG. 10A after the floating gate has been formed and the ONO dielectric has been added covering the floating gate.

FIG. 10B shows the product of FIG. 10A after the floating gate 33' has been formed and the ONO dielectric 41 has been added covering the floating gate 33'.

Figure 10C:
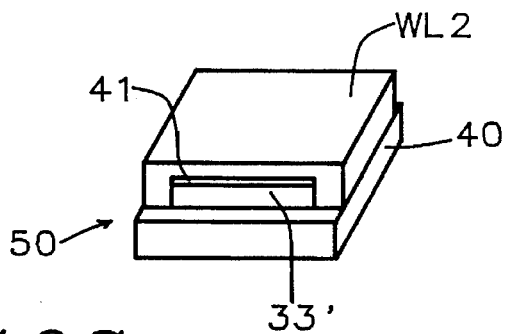
FIG. 10C shows the product of FIG. 10B after a dielectric layer has been formed over floating gate and after word line WL2 has been added to the device.

FIG. 10C shows the product of FIG. 10B after a dielectric layer (ONO) 41 has been formed over floating gate 33' and after word line WL2 has been added to the device.

EXAMPLE 1

Pocket Type Flat Cell

Figure 11:
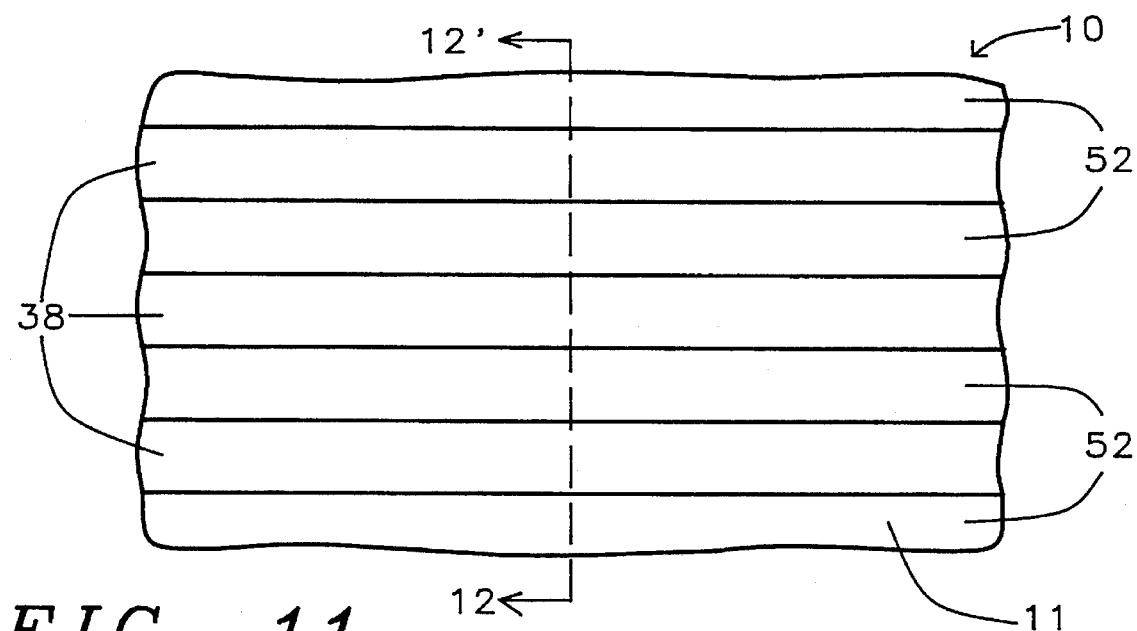
FIG. 11 shows a plan view of a device in accordance with this invention with a substrate in which a parallel array of field implantation regions has been formed.

FIG. 11 shows a plan view of a device in accordance with this invention with a substrate 11 in which a parallel array of field implantation regions 38 has been formed.

Figure 12:
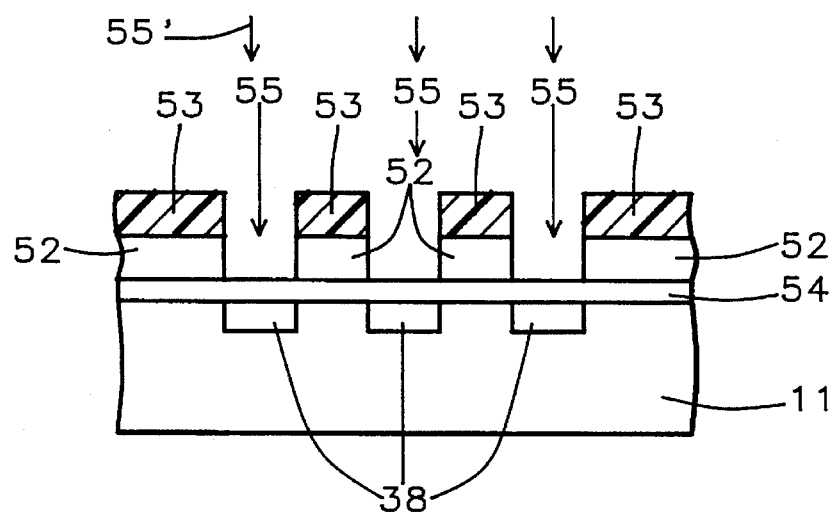
FIG. 12 is a sectional view taken along line 12—12 in FIG. 11 showing a PAD oxide layer on the surface of device over the regions and the silicon nitride layer structure deposited upon the layer patterned by forming a photoresist mask.
Figure 17A:
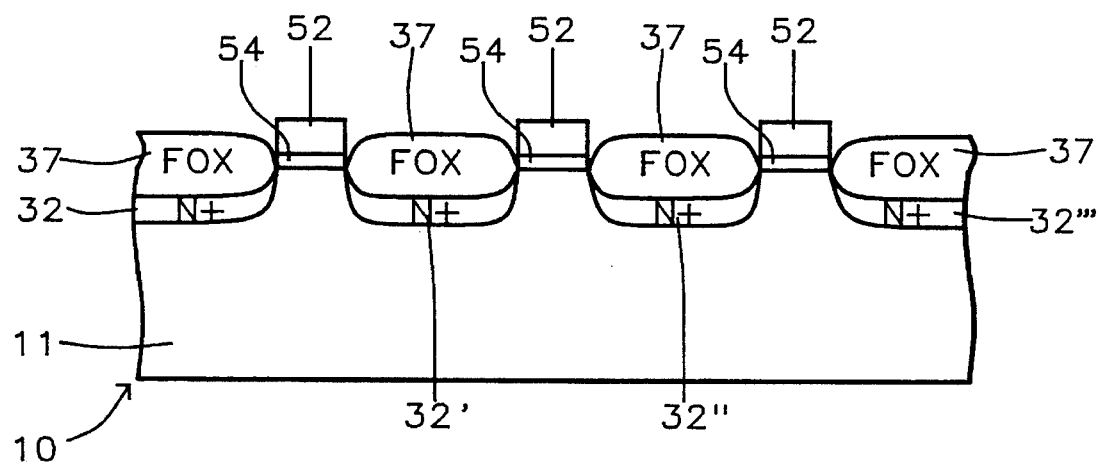
FIG. 17A shows the device of FIG. 16A after a thermal oxidation process has been performed to form field oxide regions for both the cell and the peripheral devices.

FIG. 12 is a sectional view taken along line 12—12 in FIG. 11 showing a PAD oxide layer 54 on the surface of device 11 over the regions 38 and the silicon nitride layer 52 structure deposited upon the layer 54 patterned by forming photoresist mask 53. The mask 53 is used for etching silicon nitride layer 52 to form the field implantation regions 38 by ion implantation of dopant 55' into openings 55 to provide $V_{FTH}$ (field threshold voltage.) Another key purpose is to prepare for the LOCOS field oxide formation as shown in FIG. 17A.

Figure 13:
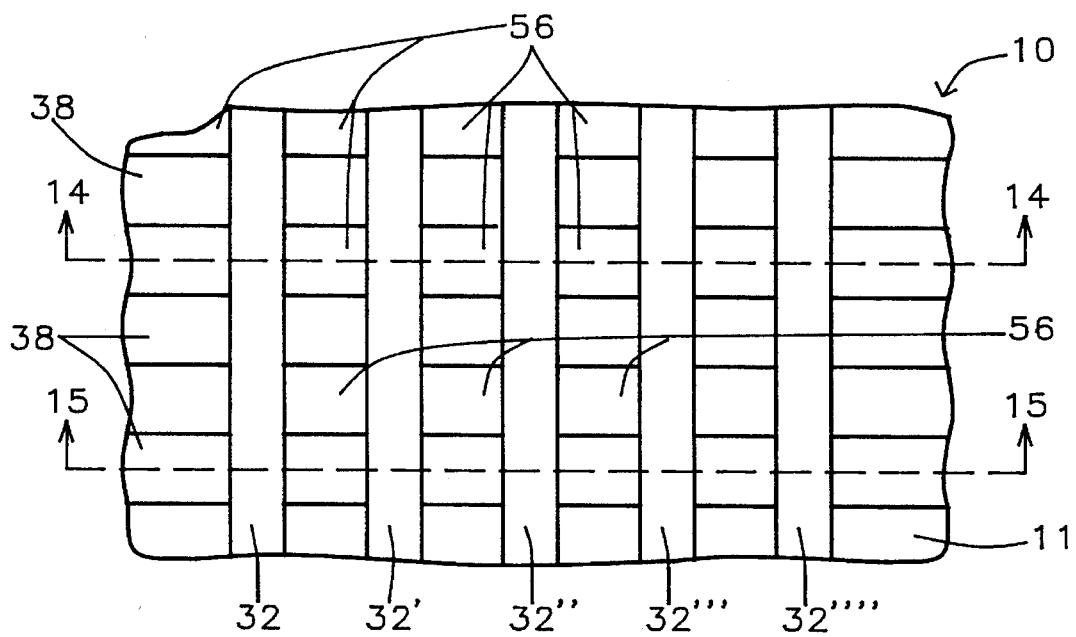
FIG. 13 is a plan view of the device of FIG. 11 after formation of a photoresist mask over device for further patterning of silicon nitride layer with a substrate 11 on which a parallel array of field implantation regions have been formed and after vertical N+ buried bit lines have been formed.
Figure 14:
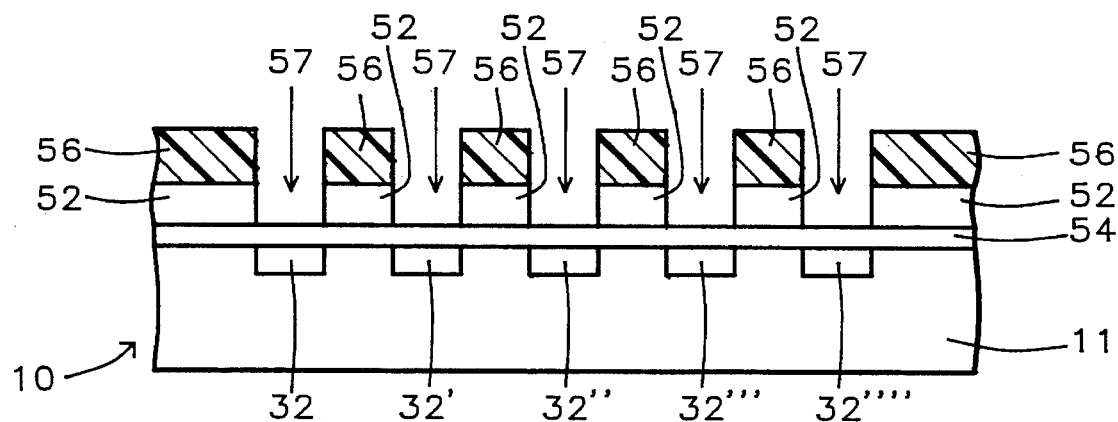
FIG. 14 is a section of FIG. 13 taken along line 14—14.
Figure 15:
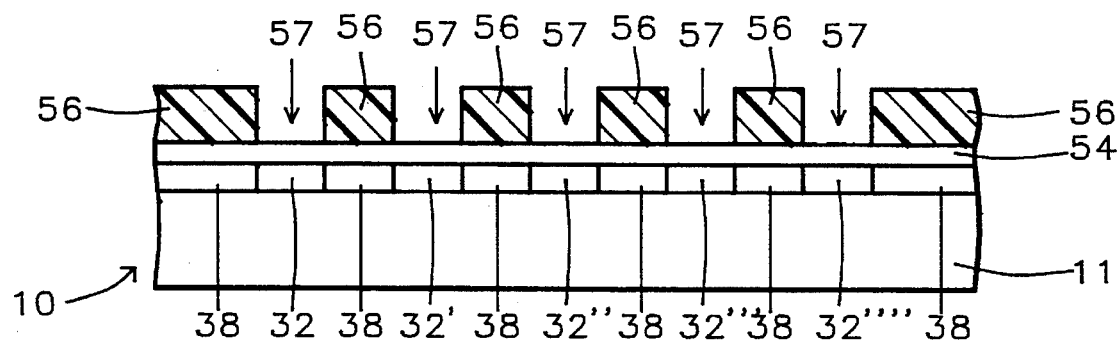
FIG. 15 is a section taken along line 15—15 of FIG. 13 which illustrate the process steps involved in producing the product shown in FIG. 13 from the device shown in FIGS. 11 and 12.

FIG. 13 is a plan view of the device of FIG. 11 after formation of a photoresist mask 56 over device 10 for further patterning of silicon nitride layer 52 with a substrate 11 on which a parallel array of field implantation regions 38 have been formed and after vertical N+ buried bit lines 32, 32', 32'', 32''' and 32'''' have been formed FIG. 14 is a section of FIG. 13 taken along line 14—14 and FIG. 15 is a section taken along line 15—15 of FIG. 13 which illustrate the process steps involved in producing the product shown in FIG. 13 from the device shown in FIGS. 11 and 12.

After the patterning the silicon nitride layer 52 and after the implantation of field implant regions 38 as shown in FIG. 12, the next step is to form a second photoresist mask 56 on the surface of device 10. Mask 56 is adapted for use in forming buried N+ lines 32, 32', 32'', 32''' and 32'''' and by etching through mask 56 to pattern the same silicon nitride layer 52 to form the openings 57 down to PAD oxide layer 54. Then the ion implantation is performed for the N+ buried bit lines 32, 32', 32'', 32''' and 32''''.

P− dopant ions of boron composed of $BCl_2$, $B^{11}$, or $BF_2$ are implanted through the openings 57 in the silicon nitride layer 52 into buried bit line zones 32, 32', 32'', 32''' and 32'''' of the substrate 11 of device 10. The dopant is applied at a preferred dose of 1E12 $cm^{-2}$ of $BF_2$ at a preferred energy of 120 keV to provide a far higher level of doping than in the remainder of the device, the ions implanted to a depth of approximately 300 Å. A range of energies from approximately 30 keV to approximately 200 keV is possible. A range of doses from approximately 4E11 $cm^{-2}$ to approximately 5E12 $cm^{-2}$ is possible. A range of depths of ion implanting from approximately 300 Å to approximately 1,500 Å is possible.

The next step is to remove the mask 56 and the LOCOS process is performed to form field oxide structures.

Figure 16A:
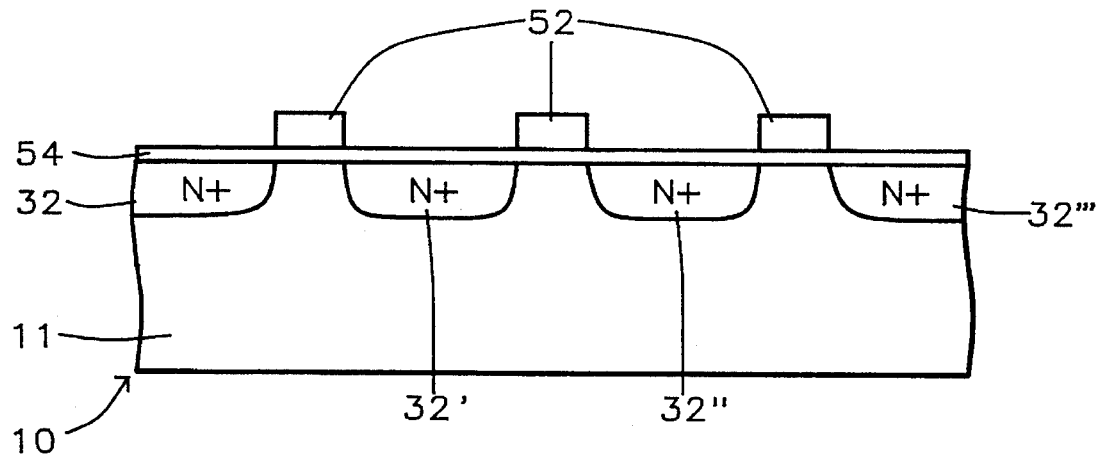
FIG. 16A shows a portion of a device similar to the device of FIG. 14 with a P− silicon substrate in which a number of N+ buried bit lines have been formed.

FIG. 16A shows a portion of a device similar to the device of FIG. 14 with a P− silicon substrate 11 in which a number of N+ buried bit lines 32, 32', 32'', 32''' and 32'''' have been formed. Between the bit lines on the surface, silicon nitride mask patterns 56 have been formed as described above.

FIG. 17A shows the device of FIG. 16A after a thermal oxidation process has been performed to form field oxide regions 37 for both the cell and the peripheral devices.

Figure 18A:
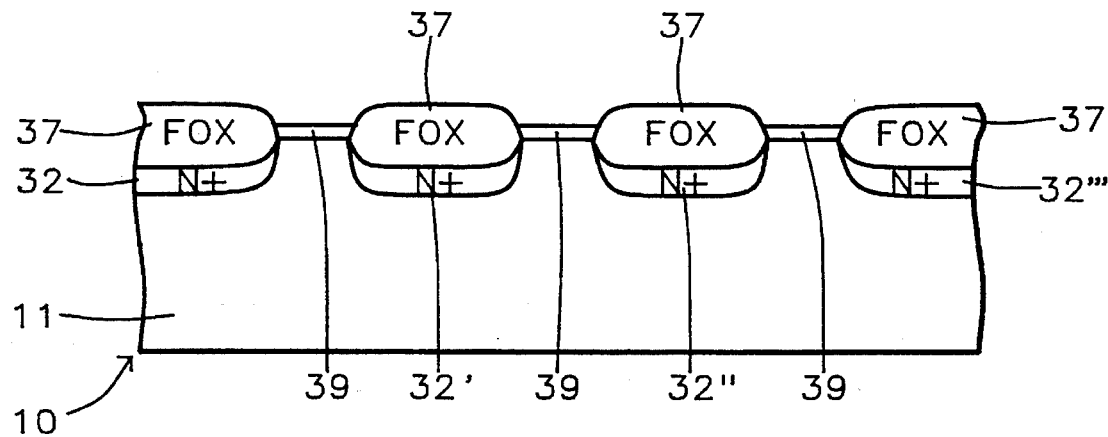
FIG. 18A shows the device of FIG. 17A after the silicon nitride has been removed by wet or dry etching, and after an oxide dielectric or channel has been grown on the surface of the substrate.

FIG. 18A shows the device of FIG. 17A after the silicon nitride 52 has been removed by wet or dry etching, and after an oxide dielectric or channel 39 has been grown on the surface of the substrate 11 with a thickness of about 120 Å to 300 Å providing a hot electron injection process for writing data into the memory cell. By "hot electron" we are referring to electrons having an energy level high enough to have an electron velocity of about $10^7$ cm/sec.

Figure 19A:
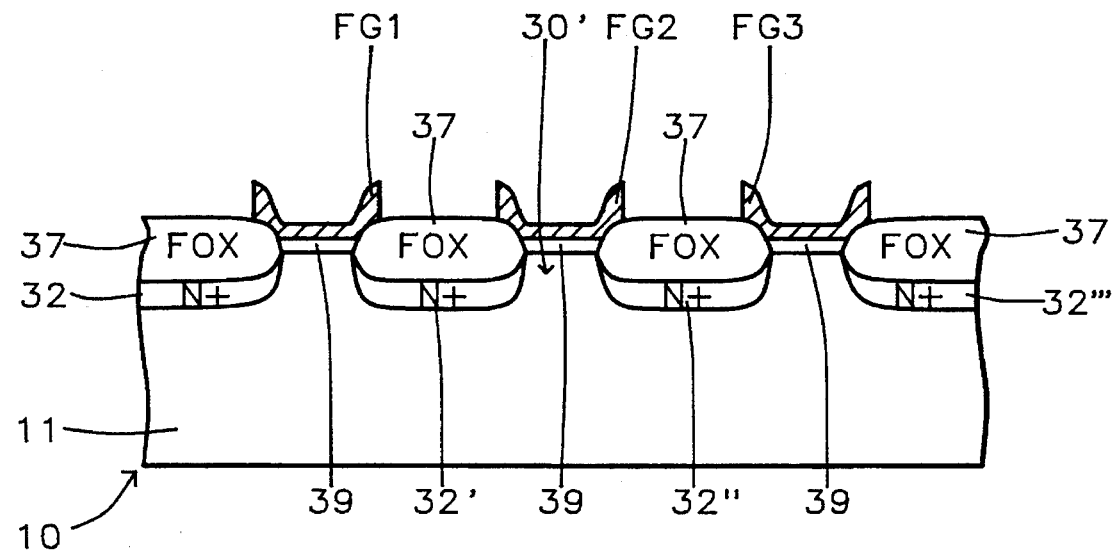
FIG. 19A shows the device of FIG. 18A after the polysilicon 1 layer is deposited forming floating gates.
Figure 18B:
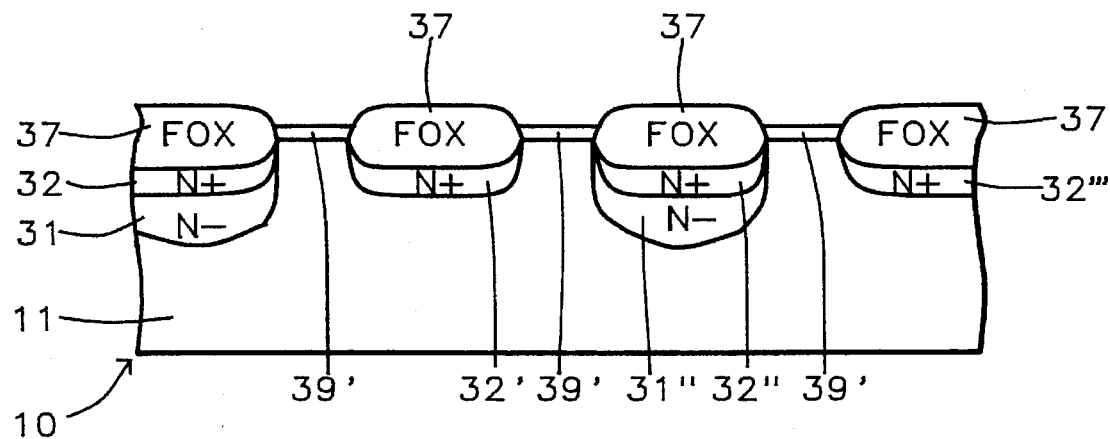
Figure 19B:
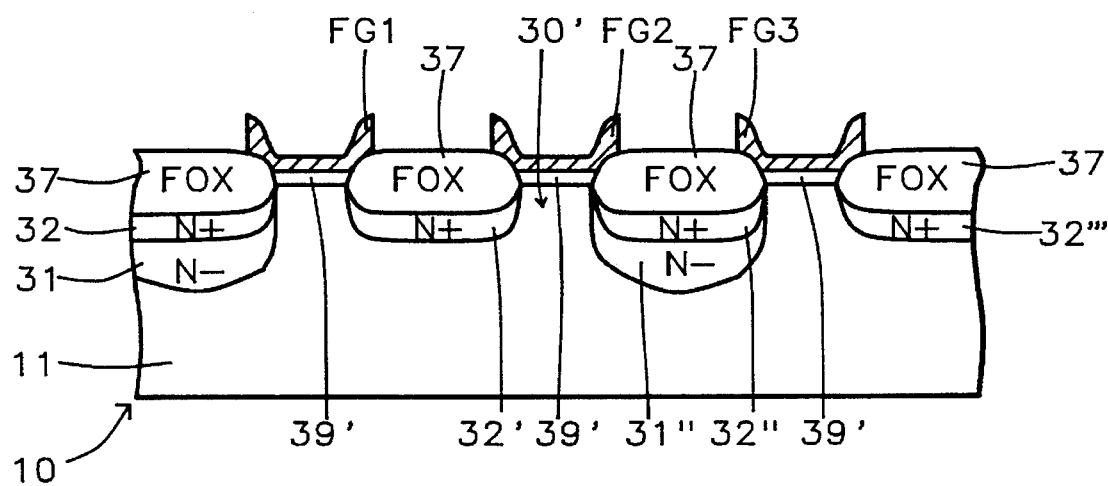

FIG. 19A shows the device of FIG. 18A after the polysilicon 1 layer is deposited forming floating gates FG1, FG2 and FG3.

Figure 20A:
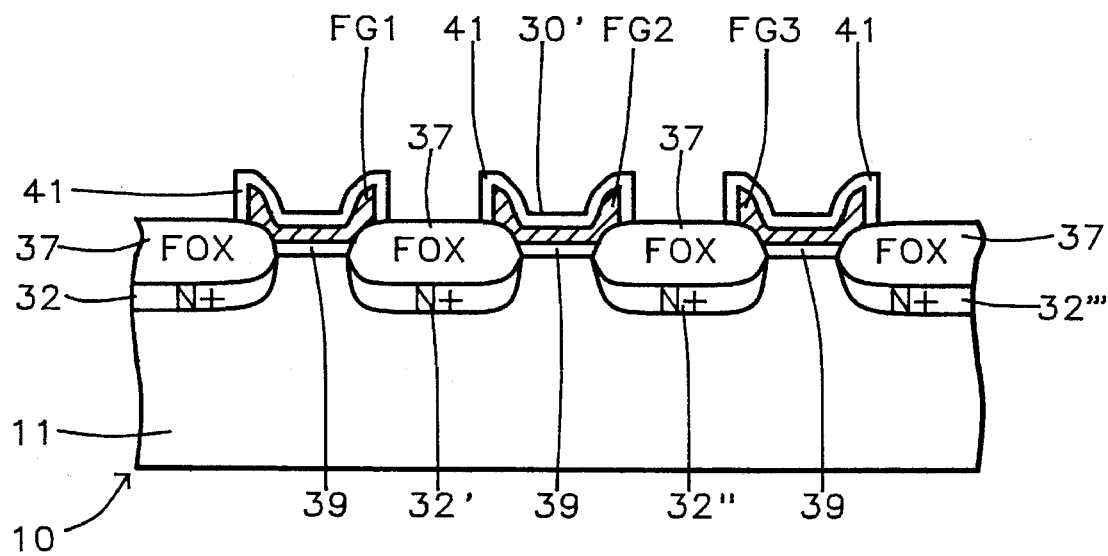
FIG. 20A shows the device of FIG. 19A after the ONO or interpolysilicon dielectric layer has been formed upon the floating gates.

FIG. 20A shows the device of FIG. 19A after the ONO or interpolysilicon dielectric layer 41 has been formed upon the floating gates FG1, FG2 and FG3.

Figure 21A:
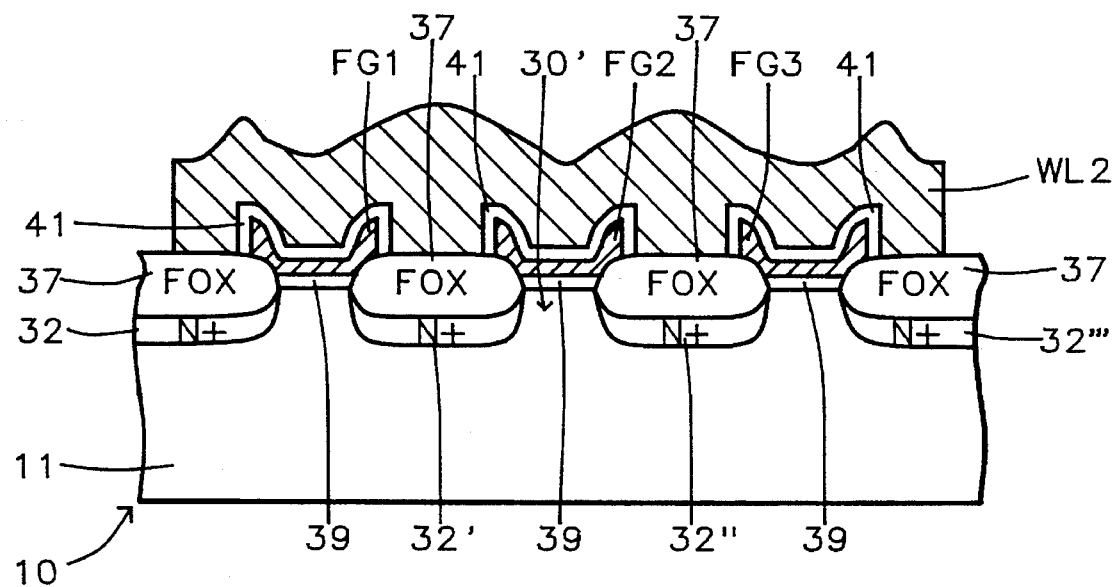
FIG. 21A shows the device of FIG. 20A after the word line WL2 has been formed.
Figure 20B:
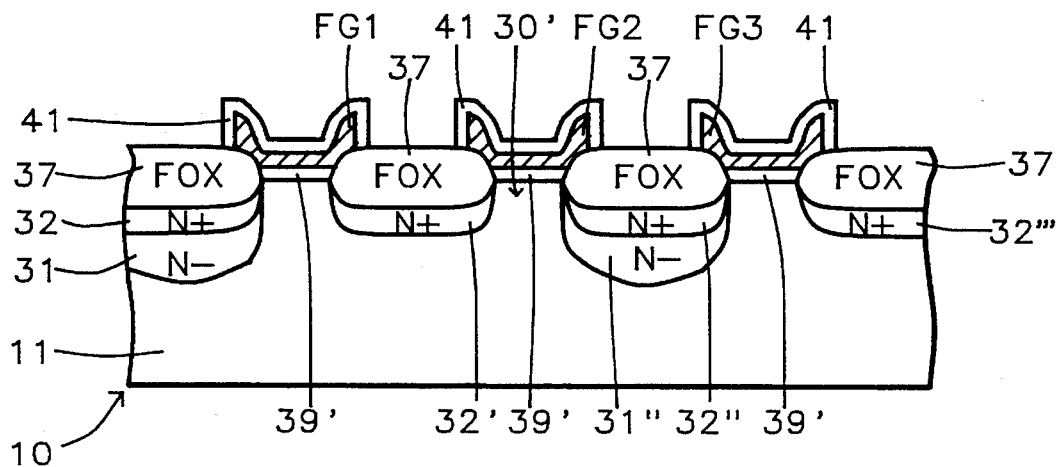
Figure 21B:
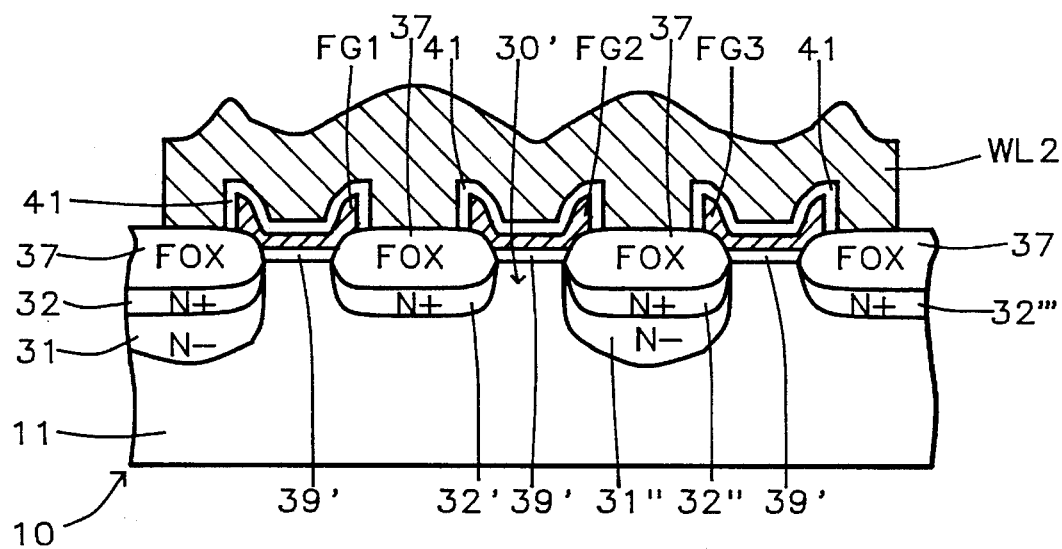

FIG. 21A shows the device of FIG. 20A after the word line WL2 has been formed.

EXAMPLE 2

Tunnel Oxide Writing

This example employs much of the same processing as in the case of Example 1. With respect to FIGS. 11–15, the processing is substantially identical to that in Example 1 so the same drawings are employed and redundant description is avoided.

The first step in forming a double-doped drain (DDD) or double-doped source (DDS) which is analogous to the double-doped drain (DDD) (Sze, VLSI Technology, McGraw-Hill Book Company, p.482 (1988) buried N+/N− lines 32, 32', 32'', 32''' and 32''''/31, and 31'') is to form a second photoresist mask on the surface and then etching the silicon nitride to form the mask regions 56. Then the ion implantation is performed for the N+/N− buried bit lines 32, 32', 32'', 32''' and 32''''/31, 31''.

The first dopant of the DDS or DDD deposit is applied with dopant ions composed of arsenic and phosphorous is implanted through the opening into zones 32, etc. and 31 etc. A photoresist mask can block the ion implantation of arsenic and phosphorus into the drain region while ion implanting the source regions. The dopant is applied at a preferred dose of 1E15 $cm^{-2}$ of arsenic (As) at a preferred energy of 80 keV to provide a far higher level of doping than in the remainder of the device. A range of energies from approximately 30 keV to approximately 200 keV is possible. A range of doses from approximately 1E14 $cm^{-2}$ to approximately 1E16 $cm^{-2}$ is possible. A range of depths of ion implanting from approximately 500 Å to approximately 5,000 Å is possible.

Next, the other dopant of the DDD or DDS deposit is applied.

Dopant ions composed of arsenic and phosphorous are implanted through the opening into zones 32, etc. or 31, etc. The dopant is applied at a preferred dose of 4E13 $cm^{-2}$ of $P^{31}$ at a preferred energy of 120 keV to provide a far higher level of doping than in the remainder of the device, and a depth of ion implanting of approximately 2,500 Å. A range of energies from approximately 50 keV to approximately 200 keV is possible. A range of doses from approximately 1E13 $cm^{-2}$ to approximately 5E14 $cm^{-2}$ is possible. A range of final depths of ion implantation from approximately 500 Å to approximately 5,000 Å is possible.

Figure 16B:
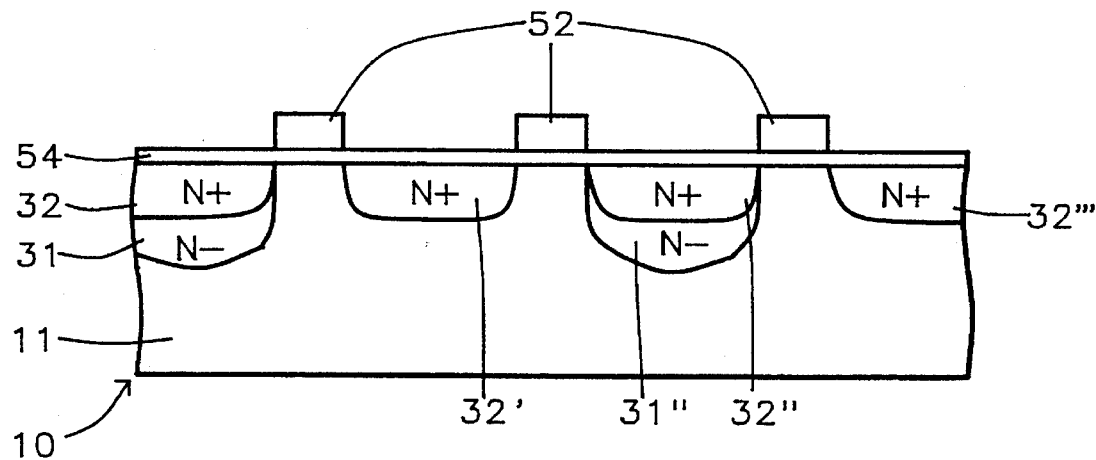
FIG. 16B shows a portion of a device similar to the device of FIG. 14 with a P− silicon substrate in which many N+ buried bit lines have been formed. Between the bit lines on the surface, silicon nitride mask patterns have been formed as described above.
Figure 17B:
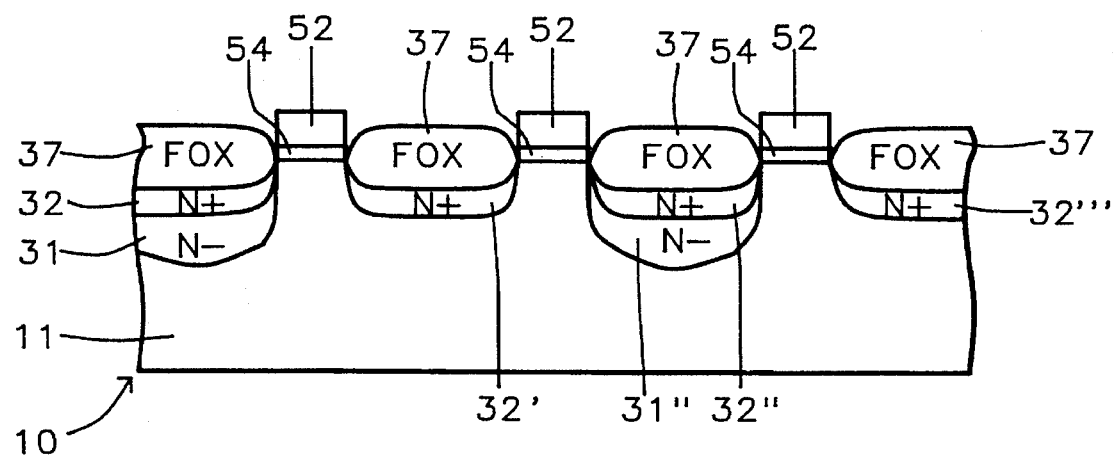
FIGS. 17B, 18B, 19B and 21B shows the device of FIG. 16B after process steps very similar to those in FIGS. 17A, 18A, 19A, 20A and 21A which are not described, as it would be redundant.

FIG. 16B shows a portion of a device similar to the device of FIG. 14 with a P− silicon substrate 11 in which many N+/N buried bit lines 32, 32', 32'', 32''', 32''''/31, 31'' have been formed. Between the bit lines on the surface, silicon nitride mask patterns 56 have been formed as described above.

FIGS. 17B–21B shows the device of FIG. 16B after process steps very similar to those in FIGS. 17A–21A which are not described, as it would be redundant.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A process of fabricating an array of floating gate flash memory devices on a substrate comprising:

forming elongated spaced apart parallel ion implanted field implant regions in said substrate;

forming elongated spaced apart parallel buried bitlines in said substrate orthogonally directed relative to said field implant regions;

forming strips of silicon nitride from patterning a silicon nitride layer on the substrate and further patterning each strip into isolated squares;

subjecting the substrate to thermal oxidation to form field oxide in all regions of the substrate surrounding the nitride squares so that said field oxide completely surrounds the nitride squares;

removing the nitride squares to form hollow, square pockets and square channel regions in said substrate underlying said hollow pockets, where said channel regions have square dimensions of about 0.3 micrometers×0.3 micrometers;

growing a silicon dioxide gate oxide layer on the exposed surfaces of said substrate in said pocket regions between field oxide regions, said silicon dioxide gate oxide layer having a thickness of from approximately one hundred twenty angstroms to three hundred angstroms;

forming a plurality of first floating gate members from a first layer of polysilicon, the dimensions of said first floating gate members selected from square dimensions between about 0.6×0.6 micrometers and 0.7×0.7 micrometers, and rectangular dimensions of about 0.5 micrometers ×0.7 micrometers, said first gate members being disposed over said gate oxide layer;

forming a layer of interpolysilicon dielectric over said first floating gate members having a thickness of approximately one hundred fifty angstroms;

forming an elongated layer of polysilicon over said layer of interpolysilicon dielectric and over said first gate members to form a second gate and a wordline, said second gate members extending perpendicular to said buried bitlines.

2. A method in accordance with claim 1 wherein the capacitive coupling ratio of said memory devices is approximately 80%.

3. A method in accordance with claim 1 wherein said silicon nitride layer and a photoresist mask are employed in forming said field implant regions about said pocket regions and said buried bit lines.

4. A process of fabricating an array of floating gate memory devices on a substrate comprising forming elongated spaced apart parallel ion implanted field implant regions in said substrate by implanting boron from dopant ion sources composed of $BCl_2$, $B^{11}$, or $BF_2$, forming elongated spaced apart parallel N+ buried bit lines doped with a dopant selected from the group consisting of arsenic and phosphorus, said buried bit lines being formed in said substrate orthogonally directed relative to said field implant regions, with at least one of said buried bit lines being double doped with N+ regions formed over N− regions, forming square pocket regions for an array of unit cells by surrounding said pocket regions with field oxide regions so that said field oxide regions completely surround said pocket regions on all sides, and growing a silicon dioxide layer over said substrate between said field oxide regions, forming a plurality of first floating gate members from a first layer of polysilicon, said first gate members being disposed over said silicon dioxide layer and said pocket regions, forming an ONO dielectric layer over said first gate members having a thickness of approximately 150 Å, forming elongated second gate, word line members from a second layer of polysilicon over said ONO layer interpolysilicon dielectric and over said first gate members, and said second gate, word line members extending perpendicular to said buried bit lines and across said first floating gate members over said pocket regions.

* * * * *